United States Patent
Ishizawa et al.

(10) Patent No.: US 12,316,077 B2
(45) Date of Patent: May 27, 2025

(54) LIGHT EMITTING APPARATUS AND PROJECTOR

(71) Applicants: SEIKO EPSON CORPORATION, Tokyo (JP); SOPHIA SCHOOL CORPORATION, Tokyo (JP)

(72) Inventors: Shunsuke Ishizawa, Tokyo-to (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 634 days.

(21) Appl. No.: 17/680,247

(22) Filed: Feb. 24, 2022

(65) Prior Publication Data

US 2022/0278508 A1    Sep. 1, 2022

(30) Foreign Application Priority Data

Feb. 26, 2021  (JP) ................. 2021-030042

(51) Int. Cl.
*H01S 5/343* (2006.01)
*G03B 21/20* (2006.01)

(52) U.S. Cl.
CPC ...... *H01S 5/34333* (2013.01); *G03B 21/2033* (2013.01)

(58) Field of Classification Search
CPC ............. H01S 5/34333; H01S 5/04253; H01S 5/04257; H01S 5/1042; H01S 5/1053;
(Continued)

(56) References Cited

U.S. PATENT DOCUMENTS

2019/0067910 A1* 2/2019 Noda ................. H01S 5/3402
2019/0267775 A1* 8/2019 Noda ................. H01S 5/3063
(Continued)

FOREIGN PATENT DOCUMENTS

JP    2015119001    6/2015
JP    2018186114    11/2018
(Continued)

OTHER PUBLICATIONS

Anurag Tyagi et al., "AlGaN-Cladding Free Green Semipolar GaN Based Laser Diode with a Lasing Wavelength of 506.4 nm," Applied Physics Express 3, Jan. 2010, pp. 1-4.

*Primary Examiner* — Xinning(Tom) Niu
(74) *Attorney, Agent, or Firm* — JCIPRNET

(57) ABSTRACT

A light emitting apparatus includes a laminated structure provided at a substrate and including a plurality of columnar sections. The plurality of columnar sections each includes a light emitting layer including a plurality of first well layers, a first semiconductor layer provided between the substrate and the light emitting layer and containing Ga and N, an optical confining layer provided between the first semiconductor layer and the light emitting layer and confining light in the light emitting layer, and a second well layer provided between the first semiconductor layer and the optical confining layer. The first well layers and the second well layer are made of InGaN. The optical confining layer includes an InGaN layer. The composition formula of the first well layers is $In_xGa_{1-x}N$. The composition formula of the InGaN layer of the optical confining layer is $In_yGa_{1-y}N$. The composition formula of the second well layer is $In_zGa_{1-z}N$. The parameters x, y, and z satisfy $0<y<z<x<1$.

3 Claims, 6 Drawing Sheets

(58) Field of Classification Search
CPC .. H01S 5/2009; H01S 5/2027; H01S 2304/12; H01S 5/11; H01S 5/185; H01S 5/34346; G03B 21/2033
See application file for complete search history.

(56) References Cited

U.S. PATENT DOCUMENTS

2020/0041889 A1* 2/2020 Ishizawa ................. H01S 5/423
2020/0106244 A1* 4/2020 Noda .................... H01S 5/3063

FOREIGN PATENT DOCUMENTS

| JP | 2020024982 | 2/2020 |
| JP | 2020057640 | 4/2020 |

* cited by examiner

LIGHT EMITTING APPARATUS AND PROJECTOR

The present application is based on, and claims priority from JP Application Serial Number 2021-030042, filed Feb. 26, 2021, the disclosure of which is hereby incorporated by reference herein in its entirety.

BACKGROUND

1. Technical Field

The present disclosure relates to a light emitting apparatus and a projector.

2. Related Art

Semiconductor lasers are expected as a high-luminance, next-generation light source. Among the semiconductor lasers, those using nanocolumns are expected to achieve high power light emission at small radiation angles based on the photonic crystal effect provided by the nanocolumns.

For example, JP-A-2020-24982 describes a light emitting apparatus including a plurality of columnar sections each including an n-type first semiconductor layer, a light emitting layer having a well structure, and a p-type second semiconductor layer. The upper surface of the n-type first semiconductor layer has a hexagonal pyramidal shape formed of facet planes.

In the light emitting apparatus described above, to achieve a uniform light emission characteristic of the well layer that form each of the light emitting layers, the well layer is grown under the condition that the flatness thereof increases. When a disk-shaped light emitting layer including a plurality of well layers is grown at an upper portion of the hexagonal pyramid under the condition described above, for example, a well layer having a small diameter is initially formed at the tip of the hexagonal pyramid, and the diameter of the well layer increases as the well layer lamination proceeds. The plurality of well layers therefore vary in shape. The variation in the shape of the plurality of well layers undesirably results in a non-uniform emission characteristic.

SUMMARY

A light emitting apparatus according to an aspect of the present disclosure includes a substrate and a laminated structure provided at the substrate and including a plurality of columnar sections. The plurality of columnar sections each includes a light emitting layer including a plurality of first well layers, a first semiconductor layer provided between the substrate and the light emitting layer and containing Ga and N, an optical confining layer provided between the first semiconductor layer and the light emitting layer and confining light in the light emitting layer, and a second well layer provided between the first semiconductor layer and the optical confining layer. The first well layers and the second well layer are made of InGaN. The optical confining layer includes an InGaN layer. A composition formula of the first well layers is $In_xGa_{1-x}N$. A composition formula of the InGaN layer of the optical confining layer is $In_yGa_{1-y}N$. A composition formula of the second well layer is $In_zGa_{1-z}N$. The parameters x, y, and z satisfy $0<y<z<x<1$.

A projector according to another aspect of the present disclosure includes the light emitting apparatus according to the aspect of the present disclosure.

DESCRIPTION OF EXEMPLARY EMBODIMENTS

A preferable embodiment of the present disclosure will be described below in detail with reference to the drawings. It is not intended that the embodiment described below unduly limits the contents of the present disclosure described in the claims. Furthermore, all configurations described below are not necessarily essential configuration requirements of the present disclosure.

1. Light Emitting Apparatus

1.1. Overall Configuration

Figure 1:
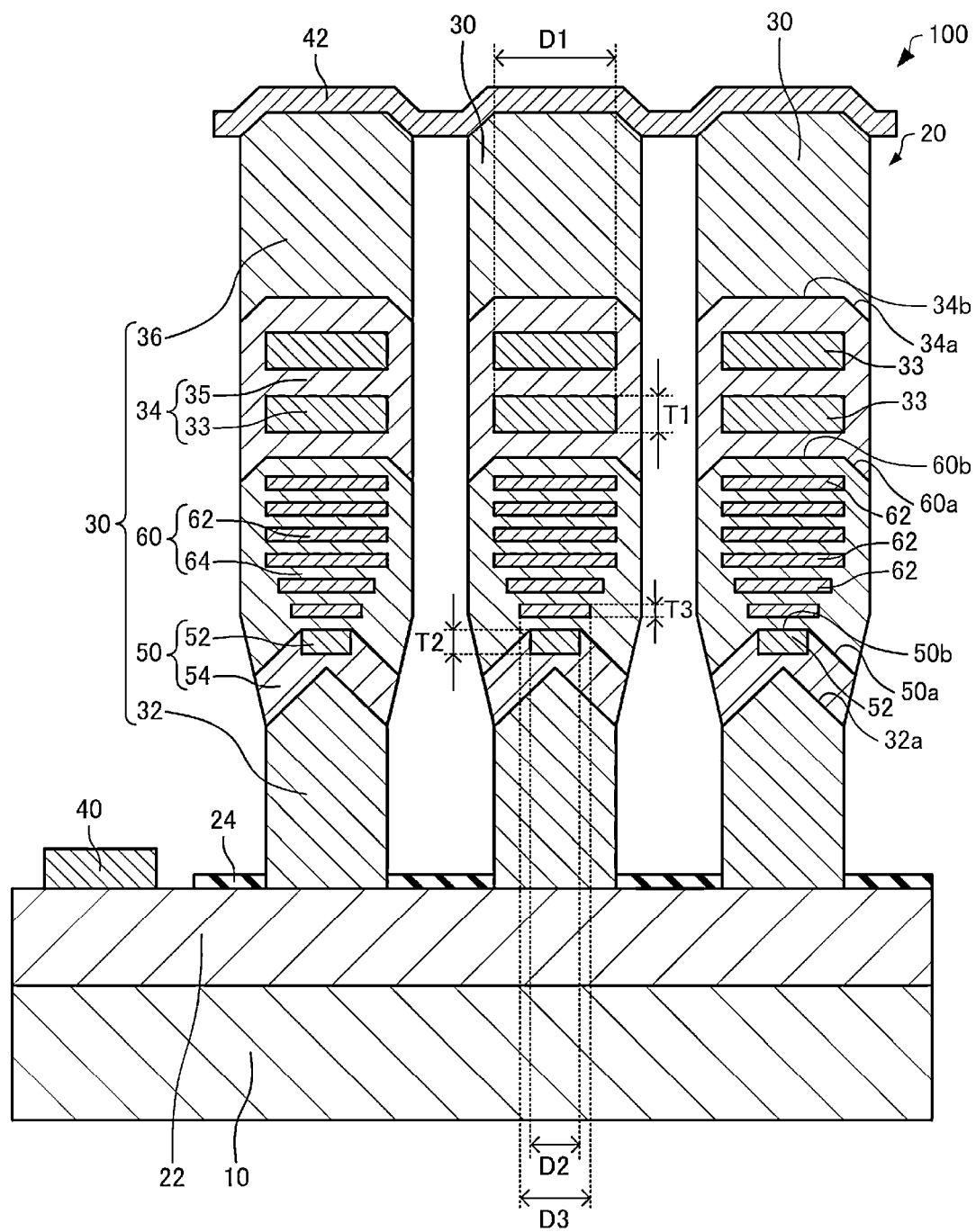
FIG. 1 is a cross-sectional view diagrammatically showing a light emitting apparatus according to an embodiment of the present disclosure.

A light emitting apparatus according to the present embodiment will first be described with reference to the drawings. FIG. 1 is a cross-sectional view diagrammatically showing a light emitting apparatus 100 according to the present embodiment.

The light emitting apparatus 100 includes, for example, a substrate 10, a laminated structure 20, a first electrode 40, and a second electrode 42, as shown in FIG. 1. The light emitting apparatus 100 is a semiconductor laser.

The substrate 10 is, for example, an Si substrate, a GaN substrate, a sapphire substrate, or an SiC substrate.

The laminated structure 20 is provided at the substrate 10. In the illustrated example, the laminated structure 20 is provided on the substrate 10. The laminated structure 20 includes, for example, a buffer layer 22 and columnar sections 30.

The present specification will be described on the assumption that in a lamination direction of the laminated structure 20 (hereinafter also simply referred to as "lamination direction"), the direction from light emitting layers 34, which serve as a reference, toward second semiconductor layers 36 is called an "upward direction" and the direction from the light emitting layers 34 toward first semiconductor layers 32 is called a "downward direction". The directions perpendicular to the lamination direction are also called "in-plane directions". The "lamination direction of the laminated structure 20" refers to the direction in which the first semiconductor layer 32 and the light emitting layer 34 of each of the columnar sections 30 are laminated structured on each other.

The buffer layer 22 is provided on the substrate 10. The buffer layer 22 is, for example, an n-type GaN layer having been doped with Si. A mask layer 24 for forming the columnar sections 30 is provided on the buffer layer 22. The mask layer 24 is, for example, a silicon oxide layer, a titanium layer, a titanium oxide layer, or an aluminum oxide layer.

The columnar sections 30 are provided on the buffer layer 22. The columnar sections 30 each have a columnar shape protruding upward beyond the buffer layer 22. In other words, the columnar sections 30 protrude upward from the substrate 10 through the buffer layer 22. The columnar sections 30 are also called, for example, nanocolumns, nanowires, nanorods, and nanopillars. The columnar sections 30 each have, for example, a hexagonal planar shape or any other polygonal planar shape or a circular planar shape.

The columnar sections 30 each have a diameter, for example, greater than or equal to 50 nm but smaller than or equal to 500 nm. When the diameter of each of the columnar sections 30 is smaller than or equal to 500 nm, a high-quality-crystal light emitting layer 34 can be produced, and distortion intrinsically present in the light emitting layer 34 can be reduced. The light generated in the light emitting layer 34 can thus be efficiently amplified.

In a case where the columnar sections 30 each have a circular planar shape, the term "the diameter of each of the columnar sections" refers to the diameter of the circular shape, and in a case where the columnar sections 30 each have a non-circular planar shape, the term refers to the diameter of a minimum circle encompassing the non-circular shape therein. For example, in a case where the columnar sections 30 each have a polygonal planar shape, the diameter of each of the columnar sections 30 is the diameter of a minimum circle encompassing the polygonal shape therein, and in a case where the columnar sections 30 each have an elliptical planar shape, the diameter of each of the columnar sections 30 is the diameter of a minimum circle encompassing the elliptical shape therein. The same holds true for the "diameter of a layer".

The plurality of columnar sections 30 are provided. The distance between adjacent columnar sections 30 is, for example, greater than or equal to 1 nm but smaller than or equal to 500 nm. The plurality of columnar sections 30 are arranged in predetermined directions at predetermined intervals when viewed in the lamination direction. The plurality of columnar sections 30 are arranged, for example, in a triangular or square lattice. The plurality of columnar sections 30 can provide the photonic crystal effect.

The "interval between the columnar sections" is the distance between the centers of columnar sections 30 adjacent to each other in any of the predetermined direction. In the case where the columnar sections 30 each have a circular planar shape, the term "the center of each of the columnar sections" refers to the center of the circle, and in the case where the columnar sections 30 each have a non-circular planar shape, the term refers to the center of the minimum circle encompassing the non-circular shape therein. For example, in the case where the columnar sections 30 each have a polygonal planar shape, the center of each of the columnar sections 30 is the center of a minimum circle encompassing the polygonal shape therein, and in the case where the columnar sections 30 each have an elliptical planar shape, the center of each of the columnar sections 30 is the center of a minimum circle encompassing the elliptical shape therein.

The columnar sections 30 each include the first semiconductor layer 32, the light emitting layer 34, and the second semiconductor layer 36. The columnar sections 30 each further include a third semiconductor layer 50 and an optical confining layer 60. The detailed configuration of each of the columnar sections 30 will be described later.

The first semiconductor layer 32 is provided on the buffer layer 22. The first semiconductor layer 32 is provided between the substrate 10 and the light emitting layer 34. The first semiconductor layer 32 is a layer containing Ga and N. The first semiconductor layer 32 is, for example, an n-type GaN or AlGaN layer having been doped with Si.

The light emitting layer 34 is provided between the first semiconductor layer 32 and the second semiconductor layer 36. The light emitting layer 34 generates light when current is injected thereinto. The light emitting layer 34 includes, for example, first well layers 33 and first barrier layers 35. The first well layers 33 and the first barrier layers 35 are each an i-type semiconductor layer having been intentionally doped with no impurities. The first well layers 33 are each an InGaN layer. The first well layers 33 are made of InGaN. The first barrier layers 35 are each, for example, a GaN layer. The plurality of first well layers 33 and first barrier layers 35 are provided. In the illustrated example, two first well layers 33 are provided. The first well layers 33 are each sandwiched between two of the first barrier layers 35. The light emitting layer 34 has a multiple quantum well (MQW) structure formed of the first well layers 33 and the first barrier layers 35.

The second semiconductor layer 36 is provided on the light emitting layer 34. The second semiconductor layer 36 is a layer different from the first semiconductor layer 32 in terms of conductivity type. The second semiconductor layer 36 is a layer containing Ga and N. The second semiconductor layer 36 is, for example, a p-type GaN layer or AlGaN layer having been doped with Mg. The first semiconductor layer 32 and the second semiconductor layer 36 form a cladding layer having the function of confining the light in the light emitting layer 34. Although not shown, the second semiconductor layer 36 may include an electron blocking layer (EBL).

The first electrode 40 is provided on the buffer layer 22. The buffer layer 22 may be in ohmic contact with the first electrode 40. The first electrode 40 is electrically coupled to the first semiconductor layers 32. In the illustrated example, the first electrode 40 is electrically coupled to the first semiconductor layers 32 via the buffer layer 22. The first electrode 40 is one of the electrodes for injecting the current into the light emitting layers 34. The first electrode 40 is, for example, a laminated structure of a Cr layer, a Ni layer, and an Au layer laminated structured on each other in the presented order from the side facing the buffer layer 22.

The second electrode 42 is provided on the second semiconductor layers 36. The second electrode 42 is electrically coupled to the second semiconductor layers 36. The second semiconductor layers 36 may be in ohmic contact with the second electrode 42. The second electrode 42 is the other one of the electrodes for injecting the current into the light emitting layers 34. The second electrode 42 is made, for example, of an indium tin oxide (ITO).

1.2. Detailed Configuration of Columnar Section

The columnar sections 30 each include the first semiconductor layer 32, the light emitting layer 34, the second semiconductor layer 36, the third semiconductor layer 50, and the optical confining layer 60, as shown in FIG. 1. The first semiconductor layer 32, the light emitting layer 34, the second semiconductor layer 36, the third semiconductor layer 50, and the optical confining layer 60 are made, for example, of a group-III nitride semiconductor and each have a wurtzite crystal structure.

The third semiconductor layer 50 is provided on the first semiconductor layer 32. The third semiconductor layer 50 is provided between the first semiconductor layer and the optical confining layer 60. The first semiconductor layer 32 has a facet plane 32a. The facet plane 32a inclines with respect to the upper surface of the substrate 10. In the illustrated example, the surface on the opposite side of the first semiconductor layer 32 from the substrate 10 is formed of the facet plane 32a and has no c plane parallel to the upper surface of the substrate 10. The third semiconductor layer 50 is provided at the facet plane 32a.

The third semiconductor layer 50 includes a second well layer 52 and a second barrier layer 54. The second well layer 52 is a quantum well layer. The second barrier layer 54 surrounds the second well layer 52 when viewed in the lamination direction. The second barrier layer 54 is provided between the second well layer 52 and the first semiconductor layer 32. The third semiconductor layer 50 has a facet plane 50a and a c plane 50b. In the illustrated example, the facet plane 50a is formed of the second barrier layer 54. The c plane 50b is formed of the second well layer 52. The second well layer 52 is an i-type InGaN layer. The second well layer 52 is made of i-type InGaN. The second barrier layer 54 is, for example, an i-type GaN layer. The numbers of second well layers 52 and second barrier layer 54 are each not limited to a specific number, and the second well layer 52 may, for example, be formed of a plurality of second well layers 52.

The optical confining layer 60 is provided on the third semiconductor layer 50. The optical confining layer 60 is provided between the third semiconductor layer 50 and the light emitting layer 34. The optical confining layer 60 includes, for example, i-type InGaN layers 62 and i-type GaN layers 64. The GaN layers 64 surround the InGaN layers 62 when viewed in the lamination direction. The second well layer 52 is sandwiched between the second barrier layer 54 and one of the GaN layers 64. In the illustrated example, the plurality of InGaN layers 62 and GaN layers 64 are provided. Specifically, five InGaN layers 62 are provided. The InGaN layers 62 are each sandwiched between two of the GaN layers 64.

The first InGaN layer 62, which is located in a position closest to the third semiconductor layer 50 among the plurality of InGaN layers 62, has a smallest diameter D3 among the diameters of the plurality of InGaN layers 62. The diameter of the second InGaN layer 62 among the plurality of InGaN layers 62 is greater than the diameter D3 of the first InGaN layer 62. The diameter of the third InGaN layer 62 among the plurality of InGaN layers 62 is greater than the diameter of the second InGaN layer 62. The diameters of the fourth and fifth InGaN layers 62 among the plurality of InGaN layers 62 are equal to the diameter of the third InGaN layer 62. The InGaN layers 62 and the GaN layers 64 form, for example, a superlattice structure. The number of InGaN layers 62 is not limited to a specific number, and only one InGaN layer 62 may be provided.

The optical confining layer 60 has a facet plane 60a and a c plane 60b. The InGaN layers 62 coincide with the c plane 60b when viewed in the lamination direction. The optical confining layer 60 can increase the refractive index of a portion in the vicinity of the light emitting layer 34. The optical confining layer 60 is an optical confinement layer (OCL) that confines the light in the light emitting layer 34.

The light emitting layer 34 is provided on the optical confining layer 60. The first well layers 33 are each a quantum well layer. The first barrier layers 35 surround the first well layers 33 when viewed in the lamination direction. The light emitting layer 34 has a facet plane 34a and a c plane 34b. The first well layers coincide with the c plane 34b when viewed in the lamination direction.

An InN mole fraction in each of the second well layer 52 and the InGaN layers 62 of optical confining layer 60 is lower than the InN mole fraction in the first well layers 33. The InN mole fraction is the ratio of the amount of substance InN to the sum of the amount of substance InN and the amount of substance GaN in a layer. The InN mole fraction in the first well layers 33 is, for example, greater than or equal to 10% but smaller than or equal to 40%. The InN mole fraction in the second well layer 52 is, for example, greater than or equal to 1% but smaller than or equal to 20%. The InN mole fraction in the InGaN layers 62 is, for example, greater than or equal to 1% but smaller than or equal to 20%. The InN mole fraction can be measured, for example, by scanning transmission electron microscope-energy dispersive X-ray spectroscopy (STEM-EDS).

The composition formula of the first well layers 33 is $In_xGa_{1-x}N$, the composition formula of the InGaN layers 62 is $In_yGa_{1-y}N$, and the composition formula of the second well layer 52 is $In_zGa_{1-z}N$, where $0<y<z<x<1$ is satisfied.

The first well layers 33, the second well layer 52, and the InGaN layers 62 of the optical confining layer 60 are each, for example, a disk-shaped layer. The second well layer 52 has a diameter D2, which is smaller than a diameter D1 of the first well layers 33 and the diameter D3 of the first InGaN layer 62 of the optical confining layer 60. In the illustrated example, the diameter D1 of the first well layers 33 is equal to the diameter of the fifth InGaN layer 62 of the optical confining layer 60.

The first well layers 33 each have a thickness T1 greater than, for example, a thickness T2 of the second well layer 52 and a thickness T3 of each of the InGaN layers 62 of the optical confining layer 60. In the illustrated example, the thickness T2 of the second well layer 52 is greater than the thickness T3 of each of the InGaN layers 62.

The second well layer 52 has a bandgap wider than the bandgap of the first well layers 33. The optical confining layer 60 has a bandgap wider than the bandgap of the first well layers 33. The bandgap can be determined by solving Schrodinger's equation based on the shape, the In composition, and other factors of each of the layers.

In the light emitting apparatus 100, the p-type second semiconductor layers 36, the i-type third semiconductor layer 50, which has been doped with no impurities, the optical confining layers 60, the light emitting layers 34, and the n-type first semiconductor layers 32 form pin diodes. In the light emitting apparatus 100, when a forward bias voltage for the pin diodes is applied to the space between the first electrode 40 and the second electrode 42, current is injected into the light emitting layers 34, whereby the electrons and holes recombine with each other in the light emitting layers 34. The recombination causes light emission. The light generated in the light emitting layers 34 propagates in the in-plane directions and forms a standing wave because of the photonic crystal effect provided by the plurality of columnar sections 30, and the standing wave receives gain in the light emitting layers 34 to undergo laser oscillation. The light emitting apparatus 100 then outputs positive first order diffracted light and negative first order diffracted light as laser light in the lamination direction.

Although not shown, a reflection layer may be provided between the substrate 10 and the buffer layer 22 or below the substrate 10. The reflection layer is, for example, a distributed Bragg reflector (DBR) layer. The reflection layer can reflect the light produced in the light emitting layers 34, whereby the light emitting apparatus 100 can emit the light only via the side facing the second electrode 42.

1.3. Effects and Advantages

In the light emitting apparatus 100, the plurality of columnar portions 30 each include the light emitting layer 34 including the plurality of first well layers 33, the first semiconductor layer 32 provided between the substrate 10 and the light emitting layer 34 and containing Ga and N, the optical confining layer 60 provided between the first semiconductor layer 32 and the light emitting layer 34 and confining light in the light emitting layer 34, and the second well layer 52 provided between the optical confining layer 60 and the light emitting layer 34. The first well layers 33 and the second well layer 52 are made of InGaN, and the optical confining layer 60 includes the InGaN layers 62. The In composition in the second well layer 52 is greater than the In composition in the InGaN layers 62 of the optical confining layer 60 but smaller than the In composition in the first well layers 33. That is, when the first well layers 33 have the composition formula of $In_xGa_{1-x}N$, the InGaN layers 62 have the composition formula of $In_yGa_{1-y}N$, and the second well layer 52 has the composition formula of $In_zGa_{1-z}N$, $0<y<z<x<1$ is satisfied.

Therefore, in the light emitting apparatus 100, variation in the diameter, the thickness, and other shape parameters of the plurality of first well layers 33 can be reduced as compared with a case where no second well layer is provided. When no second well layer is provided, the optical confining layer has a small In composition and therefore has a lattice constant close to that of the first semiconductor layer and is likely to grow into a shape following the shape of the facet plane of the first semiconductor layer. In view of the fact described above, the second well layer 52 having an In composition greater than that of the InGaN layers 62 of the optical confining layer 60 is provided. The second well layer 52 tends to have a flat upper surface due to strain caused by the difference in lattice constant from the first semiconductor layer 32. The effect of the shape of the facet plane 32a on the first well layers 33 can thus be reduced. As a result, the variation in the shape of the plurality of first well layers 33 can be reduced.

Furthermore, in the light emitting apparatus 100, the second well layer 52 is a quantum well layer and has a quantum level. The wavelength of the light emitted from the second well layer 52 is determined by the quantum level. Adjusting the quantum level in such a way that the wavelength of the light emitted from the second well layer 52 is shorter than the wavelength of the light emitted from the first well layers 33 can cause the second well layer 52 to be unlikely to emit the light even when the first electrode 40 and the second electrode 42 inject current into the second well layer 52. When the second well layer 52 emits the light, the light emitting apparatus 100 is unlikely to emit light having a desired wavelength.

In the light emitting apparatus 100, the diameter D3 of one of the InGaN layers 62 of the optical confining layer 60 is greater than the diameter D2 of the second well layer 52. Therefore, in the light emitting apparatus 100, the effect of the shape of the facet plane 32a on the first well layers 33 can be reduced as compared with a case where the diameter D3 is smaller than the diameter D2. The variation in the shape of the plurality of first well layers 33 can thus be reduced. Furthermore, the configuration in which the diameter D3 is greater than the diameter D2 allows enhancement of the optical confining effect in the light emitting layer 34 provided by the optical confining layer 60. The threshold of the laser oscillation can thus be reduced.

In the light emitting apparatus 100, the thickness T1 of the first well layers 33 is greater than the thickness T2 of the second well layer 52 and the thickness T3 of the InGaN layers 62 of the optical confining layer 60. Therefore, in the light emitting apparatus 100, the bandgap of the first well layers 33 can be narrower than the bandgap of the second well layer 52 and the bandgap of the InGaN layers 62. The first well layers 33 can thus more readily emit the light.

In the light emitting apparatus 100, the bandgap of the second well layer 52 and the bandgap of the optical confining layer 60 are wider than the bandgap of the first well layers 33. Therefore, in the light emitting apparatus 100, the second well layer 52 and the InGaN layers 62 are unlikely to emit light as compared with a case where the bandgap of the second well layer and the bandgap of the optical confining layer are narrower than the bandgap of the first well layers 33.

In the light emitting apparatus 100, the first semiconductor layer 32 has the facet plane 32a. In the light emitting apparatus 100, which includes the second well layer 52 as described above, the variation in the shape of the plurality of first well layers 33 can be reduced even when the first semiconductor layer 32 has the facet plane 32a.

2. Method for Manufacturing Light Emitting Apparatus

A method for manufacturing the light emitting apparatus 100 according to the present embodiment will next be described with reference to the drawings. FIGS. 2 to 5 are cross-sectional views diagrammatically showing the steps of manufacturing the light emitting apparatus 100 according to the present embodiment.

Figure 2:
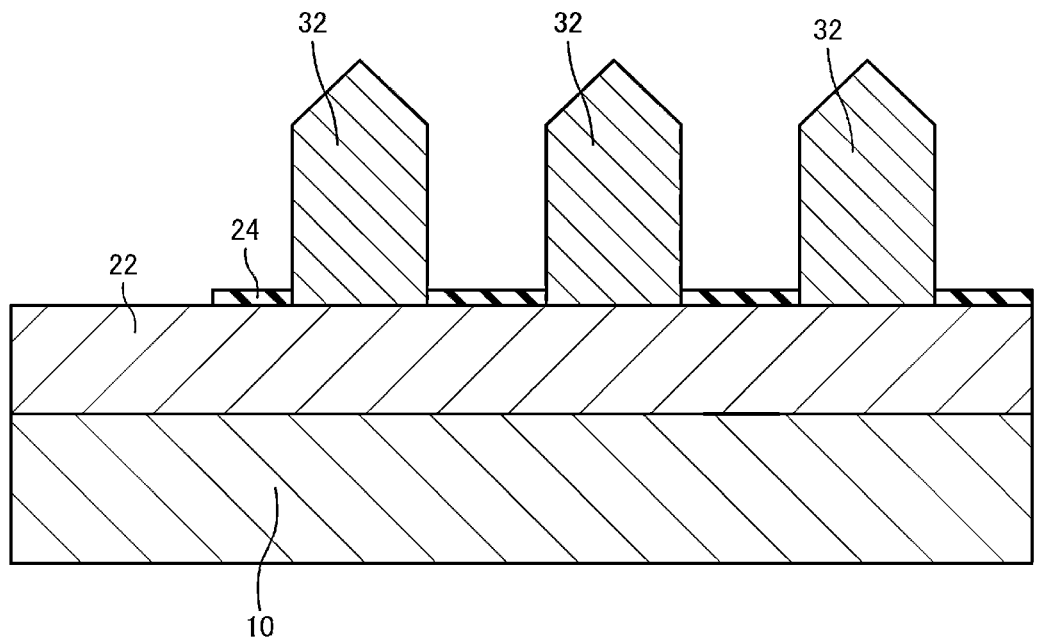
FIG. 2 is a cross-sectional view diagrammatically showing one of the steps of manufacturing the light emitting apparatus according to the embodiment.

The buffer layer 22 is epitaxially grown on the substrate 10, as shown in FIG. 2. Examples of the method for the epitaxial growth may include metal organic chemical vapor deposition (MOCVD) and molecular beam epitaxy (MBE).

The mask layer 24 is then formed on the buffer layer 22. The mask layer 24 is formed, for example, by film formation using electron beam vapor deposition or sputtering, and patterning. The patterning is performed, for example, by photolithography and etching.

The mask layer 24 is then used as a mask to epitaxially grow the first semiconductor layers 32 on the buffer layers 22. Examples of the method for the epitaxial growth may include MOCVD and MBE.

Figure 3:
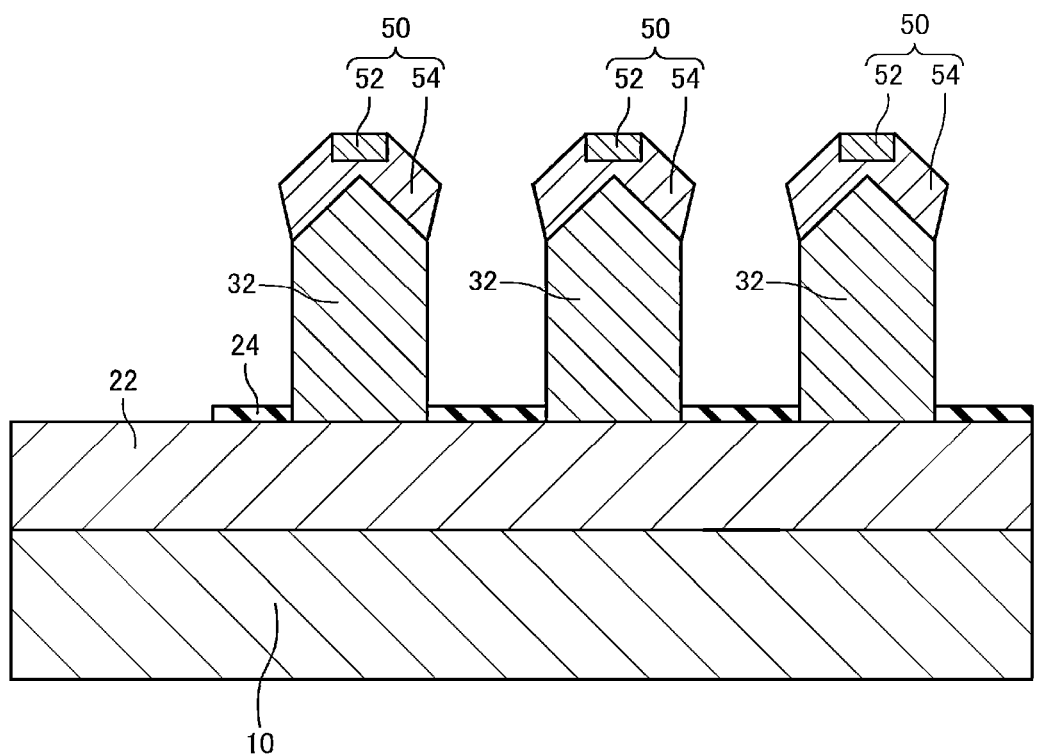
FIG. 3 is a cross-sectional view diagrammatically showing one of the steps of manufacturing the light emitting apparatus according to the embodiment.

The third semiconductor layers 50 each including the second well layer 52 and the second barrier layer 54 are epitaxially grown on the first semiconductor layers 32, as shown in FIG. 3. Examples of the method for the epitaxial growth may include MOCVD and MBE. The second well layer 52 is formed at the hexagonal pyramidal facet plane 32a, which is formed, for example, of a semipolar surface in the initial stage of the growth, so that In incorporation is unlikely to occur. As the crystal growth progresses, the c flat surface is exposed, and In is incorporated.

Figure 4:
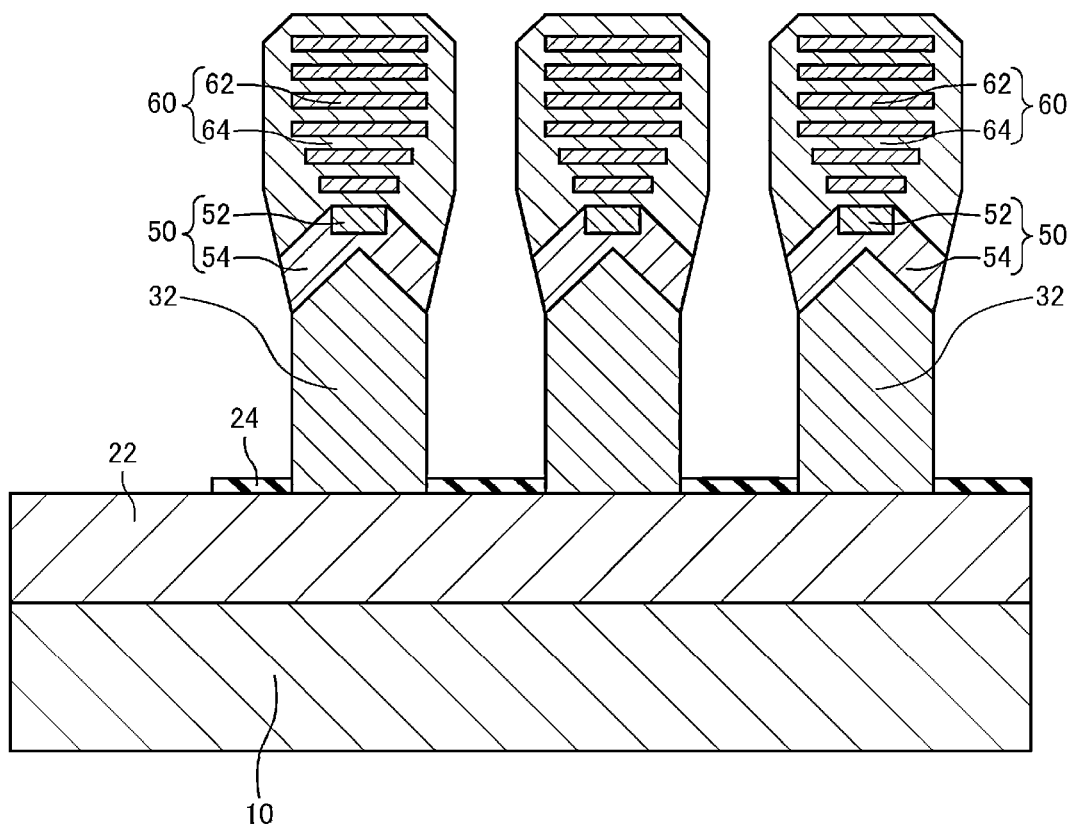
FIG. 4 is a cross-sectional view diagrammatically showing one of the steps of manufacturing the light emitting apparatus according to the embodiment.
Figure 5:
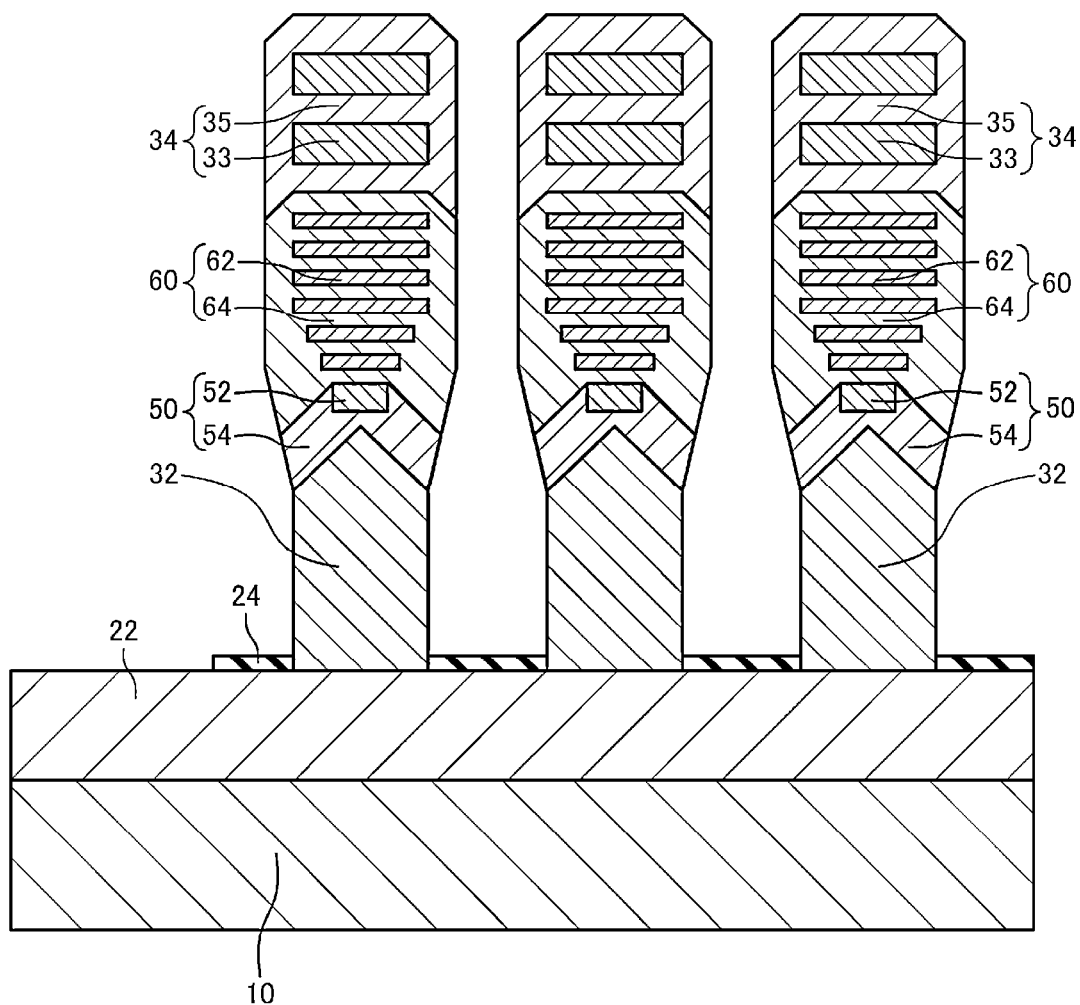
FIG. 5 is a cross-sectional view diagrammatically showing one of the steps of manufacturing the light emitting apparatus according to the embodiment.

The optical confining layers 60 each including the InGaN layers 62 and the GaN layers 64 are epitaxially grown on the third semiconductor layers 50, as shown in FIG. 4. The light emitting layers 34 each including the first well layers 33 and the first barrier layers 35 are epitaxially grown on the optical confining layers 60, as shown in FIG. 5. Examples of the method for the epitaxial growth may include MOCVD and MBE.

In the third semiconductor layers 50, the optical confining layers 60, and the light emitting layers 34, the well layers 33 and 52, which are each an InGaN layer, and the InGaN layers 62 collectively grow in central portions of the columnar sections 30. The well layers 33 and 52 and the InGaN layers 62 grow under a condition that achieves a high degree of flatness. Specifically, the amount of radiation of a III-group atom is increased. Thus, the diameter D3 of the InGaN layers 62 can be greater than the diameter D2 of the second well layer 52, and furthermore, the diameter D1 of the first well layers 33 can be greater than the diameter D3 of one of the InGaN layers 62.

In the growth of the second well layer 52, the In radiation period is set to be longer than the In radiation period in the growth of the InGaN layers 62 of the optical confining layer 60. The In composition in the second well layer 52 can thus be greater than the In composition in the InGaN layers 62. In other words, the InN mole fraction in the second well layer 52 is caused to be greater than the InN mole fraction in the InGaN layers 62. The In composition in the second well layer 52 is smaller than the In composition in the first well layers 33. That is, the InN mole fraction in the second well layer 52 is smaller than the InN mole fraction in the first well layers 33. The In radiation period in the growth of the second well layer 52 is set to be equal to the In radiation period in the growth of the first well layers 33, but not necessarily. The In radiation period in the growth of the second well layer 52 may be shorter than the In radiation period in the growth of the first well layers 33.

The state in which the In composition in the second well layer 52 is greater than the In composition in the InGaN layers 62 but smaller than the In composition in the first well layers 33 means that the composition formula of the first well layers 33 is $In_xGa_{1-x}N$, the composition formula of the InGaN layers 62 is $In_yGa_{1-y}N$, and the composition formula of the second well layer 52 is $In_zGa_{1-z}N$, where $0<y<z<x<1$.

The second semiconductor layers 36 are epitaxially grown on the light emitting layers 34, as shown in FIG. 1. Examples of the method for the epitaxial growth may include MOCVD and MBE. The laminated structure 20 including the plurality of columnar sections 30 can be formed by carrying out the steps described above.

Thereafter, the first electrode 40 is formed on the buffer layer 22, and the second electrode 42 is formed on the second semiconductor layers 36. The first electrode 40 and the second electrode 42 are formed, for example, by vacuum vapor deposition. The first electrode 40 and the second electrode 42 are not necessarily formed in a specific order.

The light emitting apparatus 100 can be manufactured by carrying out the steps described above.

3. Projector

Figure 6:
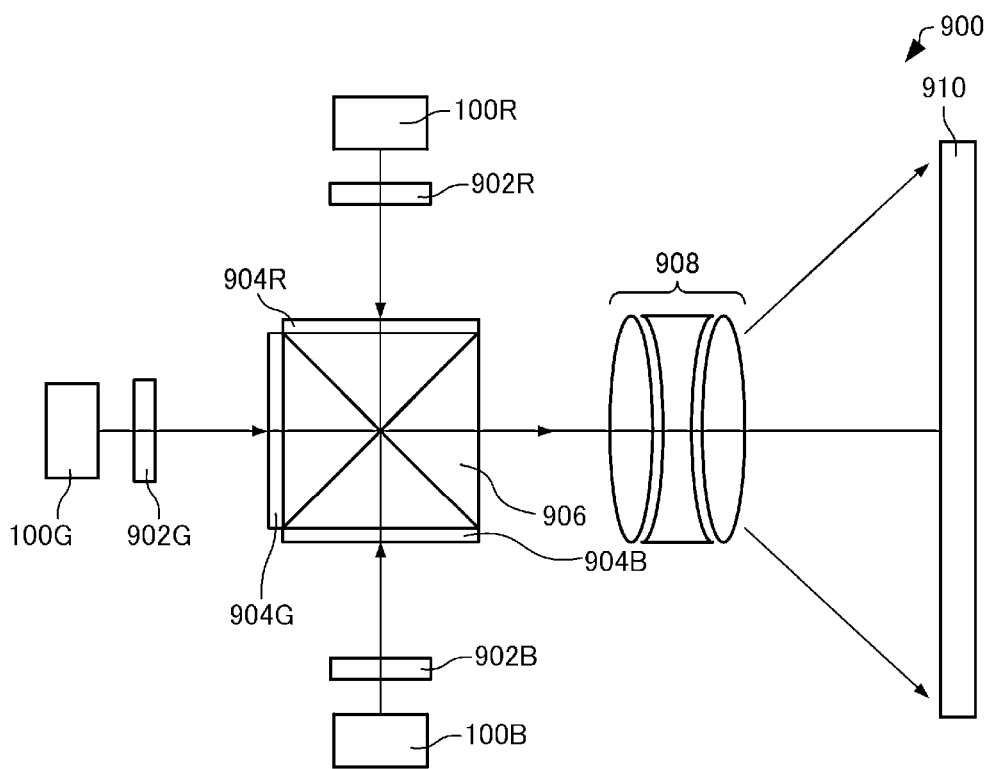
FIG. 6 diagrammatically shows a projector according to the embodiment.

A projector according to the present embodiment will next be described with reference to the drawings. FIG. 6 diagrammatically shows a projector 900 according to the present embodiment.

The projector 900 includes, for example, the light emitting apparatus 100 as a light source.

The projector 900 includes an enclosure that is not shown, and a red light source 100R, a green light source 1000, and a blue light source 100B, which are provided in the enclosure and output red light, green light, and blue light, respectively. In FIG. 6, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908, which are provided in the enclosure. The first light modulator 904R, the second light modulator 904G, and the third light modulator 904B are each, for example, a transmissive liquid crystal light valve. The projection apparatus 908 is, for example, a projection lens.

The light outputted from the red light source 100R enters the first optical element 902R. The first optical element 902R collects the light outputted from the red light source 100R. The first optical element 902R may have another function in addition to the light collection function. The same holds true for the second optical element 902G and the third optical element 902B, which will be described later.

The light collected by the first optical element 902R is incident on the first light modulator 904R. The first light modulator 904R modulates the light incident thereon in accordance with image information. The projection apparatus 908 then enlarges an image formed by the first light modulator 904R and projects the enlarged image on a screen 910.

The light outputted from the green light source 100G enters the second optical element 902G. The second optical element 902G collects the light outputted from the green light source 100G.

The light collected by the second optical element 902G is incident on the second light modulator 904G. The second light modulator 904G modulates the light incident thereon in accordance with image information. The projection apparatus 908 then enlarges an image formed by the second light modulator 904G and projects the enlarged image on the screen 910.

The light outputted from the blue light source 100B enters the third optical element 902B. The third optical element 902B collects the light outputted from the blue light source 100B.

The light collected by the third optical element 902B is incident on the third light modulator 904B. The third light modulator 904B modulates the light incident thereon in accordance with image information. The projection apparatus 908 then enlarges an image formed by the third light modulator 904B and projects the enlarged image on the screen 910.

The projector 900 can further include a cross dichroic prism 906, which combines the light outputted from the first light modulator 904R, the light outputted from the second light modulator 904G, and the light outputted from the third light modulator 904B with one another and guides the combined light to the projection apparatus 908.

The red light modulated by the first light modulator 904R, the green light modulated by the second light modulator 904G, and the blue light modulated by the third light modulator 904B enter the cross dichroic prism 906. The cross dichroic prism 906 is formed by bonding four right-angled prisms to each other, and a dielectric multilayer film that reflects the red light and a dielectric multilayer film that reflects the blue light are disposed at the inner surfaces of the combined prisms. The dielectric multilayer films combine the red light, the green light, and the blue light with one another to form light representing a color image. The combined light is then projected by the projection apparatus 908 on the screen 910, whereby an enlarged image is displayed.

The red light source 100R, the green light source 100G, and the blue light source 100B may instead directly form images in a configuration in which none of the first light modulator 904R, the second light modulator 904G, and the third light modulator 904B is used but the light emitting apparatuses 100 corresponding to the light sources are controlled as the pixels of the images in accordance with the image information. The projection apparatus 908 may then enlarge the images formed by the red light source 100R, the green light source 100G, and the blue light source 100B and project the enlarged images on the screen 910.

In the example described above, transmissive liquid crystal light valves are used as the light modulators, and light valves based not on liquid crystal materials or reflective light valves may be used. Examples of such light valves may include reflective liquid crystal light valves and digital micromirror devices. The configuration of the projection apparatus is changed as appropriate in accordance with the type of the light valves used in the projector.

The present disclosure is also applicable to a light source apparatus of a scanning-type image display apparatus including a light source and a scanner that is an image formation apparatus that displays an image having a desired size on a display surface by scanning the screen with the light from the light source.

The light emitting apparatus according to the embodiment described above can be used in other applications in addition to a projector. Examples of the applications other than a projector may include an indoor or outdoor illuminator, a display, a laser printer, a scanner, an in-vehicle light, a sensing instrument using light, and a light source of a communication instrument.

4. Example and Comparable Example

4.1. Preparation of Sample

In Example, a buffer layer, first semiconductor layers, third semiconductor layers each including a second well layer and a second barrier layer, optical confining layers (OCLs), and light emitting layers each including first well layers and first barrier layers were epitaxially grown in this order on a substrate. The epitaxial growth was performed by using molecular beam epitaxy (RF-MBE) using a radio frequency (RF) plasma nitrogen source. An n-type GaN layer was used as each of the buffer layer and the first semiconductor layers. An i-type InGaN layer was used as each of the first well layers and the second well layer. An i-type GaN layer was used as each of the first barrier layers and the second barrier layer. The OCLs were each a superlattice structure made of i-type InGaN and i-type GaN. The In radiation period was so adjusted that the In composition in the second well layer is greater than the In composition in the InGaN layers of each of the optical confining layers but smaller than the In composition in the first well layers. In other words, the InN mole fraction in the second well layer is greater than the InN mole fraction in the InGaN layers of each of the optical confining layers but smaller than the InN mole fraction in the first well layers. That is, the composition formula of the first well layers is $In_xGa_{1-x}N$, the composition formula of the InGaN layers of each of the optical confining layers is $In_yGa_{1-y}N$, and the composition formula of the second well layer is $In_zGa_{1-z}N$, where $0<y<z<x<1$ is satisfied.

In Comparative Example, the buffer layer, the first semiconductor layers, and the light emitting layers were epitaxially grown in basically the same manner as in Example, except that no second well layer or OCL was formed.

4.2. STEM Observation

Figure 7:
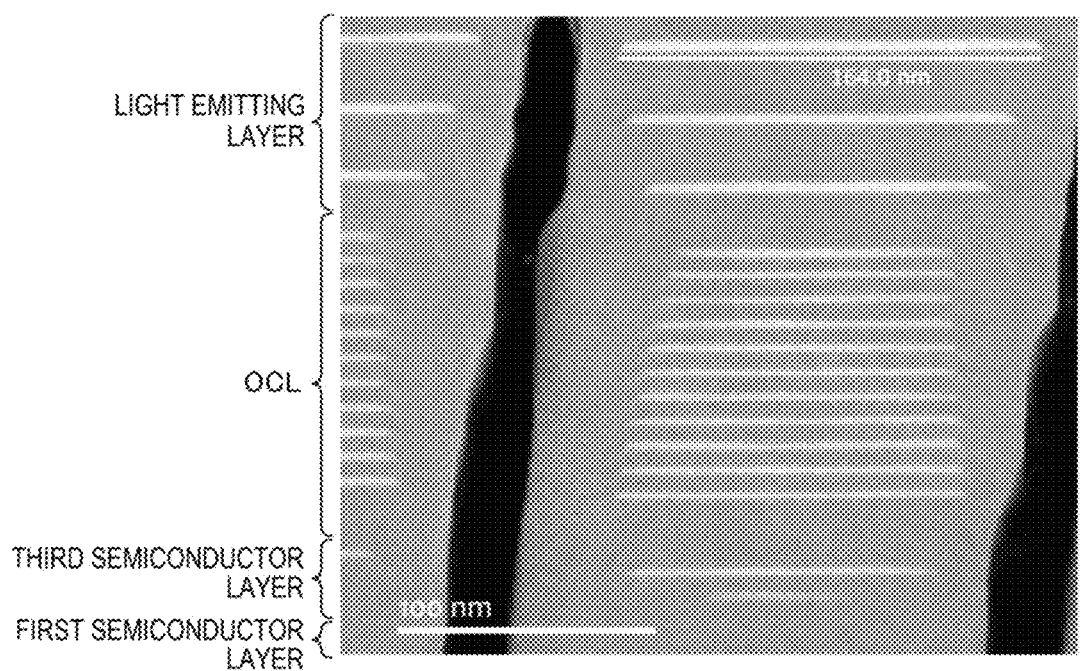
FIG. 7 is a cross-sectional STEM image in Example.
Figure 8:
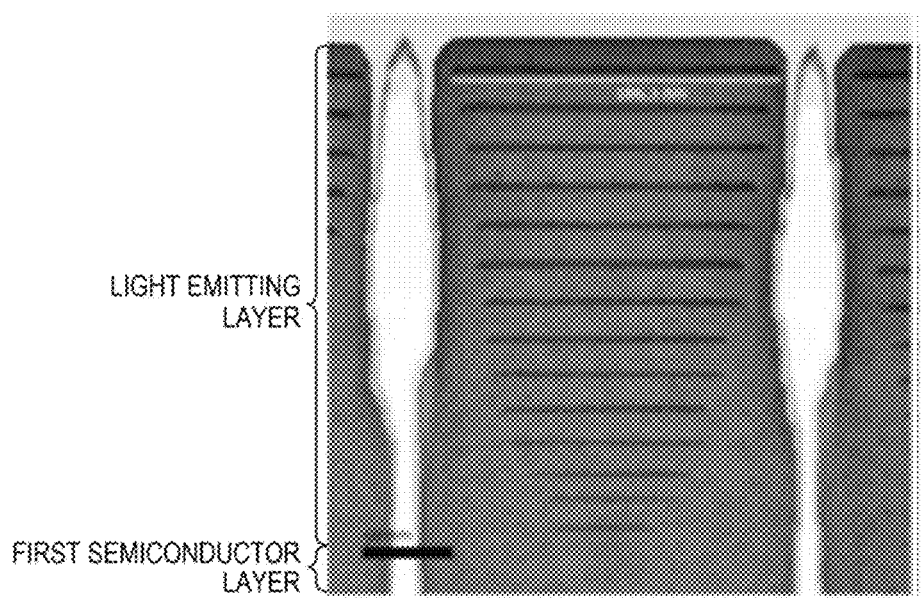
FIG. 8 is a cross-sectional STEM image in Comparative Example.

FIG. 7 is a cross-sectional STEM image in Example. FIG. 8 is a cross-sectional STEM image in Comparative Example. In FIG. 7, the InGaN layers are shown in a light color. In FIG. 8, the InGaN layers are shown in a dark color.

In FIG. 8, in the light emitting layer, lower InGaN layers had diameters extremely smaller than those of upper InGaN layers. On the other hand, FIG. 7 shows that the difference in diameter among the plurality of InGaN layers in the light emitting layer can be smaller than the difference in FIG. 8.

The present disclosure encompasses substantially the same configuration as the configuration described in the embodiment, for example, a configuration having the same function, using the same method, and providing the same result or a configuration having the same purpose and providing the same effect. Furthermore, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Furthermore, the present disclosure encompasses a configuration in which a known technology is added to the configuration described in the embodiment.

The following contents are derived from the embodiment and the variations described above.

A light emitting apparatus according to an aspect includes a substrate and a laminated structure provided at the substrate and including a plurality of columnar sections. The plurality of columnar sections each includes a light emitting layer including a plurality of first well layers, a first semiconductor layer provided between the substrate and the light emitting layer and containing Ga and N, an optical confining layer provided between the first semiconductor layer and the light emitting layer and confining light in the light emitting layer, and a second well layer provided between the first semiconductor layer and the optical confining layer. The first well layers and the second well layer are made of InGaN. The optical confining layer includes an InGaN layer. The composition formula of the first well layers is $In_xGa_{1-x}N$. The composition formula of the InGaN layer of the optical confining layer is $In_yGa_{1-y}N$. The composition formula of the second well layer is $In_zGa_{1-z}N$. The parameters x, y, and z satisfy $0<y<z<x<1$.

The light emitting apparatus can reduce the variation in the shape of the plurality of first well layers.

In the light emitting apparatus according to the aspect, in each of the plurality of columnar sections, the diameter of the InGaN layer of the optical confining layer may be greater than the diameter of the second well layer.

The light emitting apparatus can further reduce the variation in the shape of the plurality of first well layers.

In the light emitting apparatus according to the aspect, in each of the plurality of columnar sections, the thickness of each of the first well layers may be greater than the thickness of the second well layer and the thickness of the InGaN layer of the optical confining layer.

The light emitting apparatus allows the first well layers to readily emit light.

In the light emitting apparatus according to the aspect, wherein in each of the plurality of columnar sections, the bandgap of the second well layer and the bandgap of the optical confining layer may be wider than the bandgap of each of the first well layers.

The light emitting apparatus can cause the second well layer and the InGaN layer of each of the optical confining layers to be unlikely to emit light.

In the light emitting apparatus according to the aspect, in each of the plurality of columnar sections, the first semiconductor layer may have a facet plane.

In the light emitting apparatus, the second well layer can reduce the variation in the shape of the plurality of first well layers even when the first semiconductor layers each have a facet plane.

A projector according to another aspect of the present disclosure includes the light emitting apparatus according to the aspect described above.

What is claimed is:

1. A light emitting apparatus comprising:
   a substrate; and
   a laminated structure provided at the substrate and including a plurality of columnar sections,
   wherein the plurality of columnar sections each includes
   a light emitting layer including a plurality of first well layers,
   a first semiconductor layer provided between the substrate and the light emitting layer and containing Ga and N,
   an optical confining layer provided between the first semiconductor layer and the light emitting layer and confining light in the light emitting layer, and
   a second well layer provided between the first semiconductor layer and the optical confining layer,
   the first well layers and the second well layer are made of InGaN,
   the optical confining layer includes an InGaN layer,
   a composition formula of each of the first well layers is $In_xGa_{1-x}N$,
   a composition formula of the InGaN layer of the optical confining layer is $In_yGa_{1-y}N$,
   a composition formula of the second well layer is $In_zGa_{1-z}N$, and
   the parameters x, y, and z satisfy $0<y<z<x<1$,
   wherein in each of the plurality of columnar sections,
   a diameter of the InGaN layer of the optical confining layer is greater than a diameter of the second well layer, or
   a thickness of each of the first well layers is greater than a thickness of the second well layer and a thickness of the InGaN layer of the optical confining layer, or
   a bandgap of the second well layer and a bandgap of the optical confining layer are wider than a bandgap of each of the first well layers.

2. The light emitting apparatus according to claim 1, wherein in each of the plurality of columnar sections, the first semiconductor layer has a facet plane.

3. A projector comprising the light emitting apparatus according to claim 1.

* * * * *